United States Patent [19]

Hayes, deceased et al.

[11] Patent Number: 4,521,087
[45] Date of Patent: Jun. 4, 1985

[54] OPTICAL SYSTEM WITH DIFFUSER FOR TRANSFORMATION OF A COLLIMATED BEAM INTO A SELF-LUMINOUS ARC WITH REQUIRED CURVATURE AND NUMERICAL APERTURE

[75] Inventors: Lawrence P. Hayes, deceased, late of Berlin, Vt.; by Ellen J. Hayes, administratrix, Johnson City, N.Y.; Kantilal Jain, San Jose; Randall T. Kerth, Morgan Hill, both of Calif.

[73] Assignee: International Business Machines Corporation, Armonk, N.Y.

[21] Appl. No.: 497,392

[22] Filed: May 23, 1983

[51] Int. Cl.³ .............................................. G02B 27/00
[52] U.S. Cl. .................................... 350/574; 350/321; 362/259; 362/308; 362/331; 362/335
[58] Field of Search .............. 350/321, 167, 574, 420, 350/168, 433; 219/121 LP, 121 LQ, 121 LR; 362/259, 308, 331, 335

[56] References Cited

U.S. PATENT DOCUMENTS

| | | | |
|---|---|---|---|
| 2,551,954 | 5/1951 | Lehman | 350/167 |
| 3,586,813 | 6/1971 | Cruickshank et al. | 350/167 |
| 3,941,475 | 3/1976 | Sheets | 350/167 |
| 3,957,339 | 5/1976 | Engel | 350/294 |

Primary Examiner—Jon W. Henry
Attorney, Agent, or Firm—Otto Schmid, Jr.

[57] ABSTRACT

Apparatus for producing a line source of a desired shape from a light source such as an excimer laser comprising means for directing the light source along a predetermined path to a cylindrical lens positioned to produce a virtual line image having uniform intensity along its length at a first location. However, the image is intercepted by a cylindrical mirror inclined at an angle so that the beam is transformed into a curved shape and directed onto a quartz diffuser. This apparatus produces a curved self-luminous distribution having uniform intensity over its length. In a specific embodiment, the diffuser is a directional diffuser.

8 Claims, 5 Drawing Figures

OPTICAL SYSTEM WITH DIFFUSER FOR TRANSFORMATION OF A COLLIMATED BEAM INTO A SELF-LUMINOUS ARC WITH REQUIRED CURVATURE AND NUMERICAL APERTURE

DESCRIPTION

Background of the Invention

1. Field of the Invention

This invention relates to optical imaging systems and specifically concerns an optical system to transform a collimated beam into a self-luminous source with required curvature and numerical aperture.

2. Description of the Prior Art

The drive toward higher density circuitry in microelectronic devices has promoted interest in a variety of high resolution lithographic techniques which require the ability to produce finer resolution patterns at high production rates. In optical lithography, the improvement in resolution that results by use of shorter wavelengths is well known. As a result of these considerations, an effort has been made to develop processes and materials which require exposure in the deep UV spectral region. The light source traditionally used in these prior art systems has been either a deuterium lamp or a xenon-mercury arc lamp. The problem with using such lamps is that insufficient power is available from them in the desired spectral region. For a typical lamp in a typical system, the total deep UV power than can be collected for use is in the few tens of milliwatts range, so that the exposure time for photoresists that are sensitive in the deep UV are typically several minutes.

A first commonly assigned copending application, now U.S. Pat. No. 4,458,994, discloses and claims optical lithography apparatus having a pulsed excimer laser light source. This apparatus is capable of producing uniform exposure of a pattern at very fine resolution in an exposure time substantially faster than prior art systems. The pulsed excimer laser light source disclosed in that application produces a nearly collimated beam which is unsuitable for use in prior art projection systems which have been designed to utilize illumination through an arbitrary shape such as a curved slit.

A second commonly assigned copending application, now U.S. Pat. No. 4,444,456, discloses a holographic method and apparatus for transforming a light beam such as a pulsed laser light beam, for example, into an optically equivalent self-luminous source of arbitrary shape and numerical aperture.

A third commonly assigned copending application, Ser. No. 391,099, filed June 23, 1982 by Jain et al discloses an optical system for transforming a collimated light source into a self-luminous source of arbitrary shape and numerical aperture by first providing a lens array to form a plurality of point sources each having a predetermined numerical aperture and an optical fiber array positioned so that the input end of each of the optical fibers is positioned to receive the light from a different one of the lenses within the lens array and the output ends of the optical fibers are positioned to produce a self-luminous source of the desired shape and numerical aperture.

No prior art known to applicants suggests an optical system comprising conventional anamorphic optical elements to produce a self-luminous curved line source having uniform intensity along its length from a substantially collimated light source.

SUMMARY OF THE INVENTION

Briefly, according to the invention, there is provided apparatus for producing a curved line source of a desired shape from a collimated light source comprising a source for producing a large area substantially collimated beam and means for directing the beam along a predetermined path, a first optical means is positioned along the path to produce a virtual line image at a first predetermined location. A second optical means is interposed between the first optical means and the first predetermined location to produce a curved beam and to direct the beam to a second location. Third optical means is fixed at the second location to receive the beam and to produce a continuous self-luminous source of a desired shape. In a specific embodiment the third optical means comprises a directional diffuser.

The foregoing and other objects, features and advantages of the invention will be apparent from the following more particular description of a preferred embodiment of the invention as illustrated in the accompanying drawings.

BRIEF DESCRIPTION OF THE DRAWINGS

An optical system embodying the invention will now be described with reference to the accompanying drawings wherein.

DESCRIPTION OF THE PREFERRED EMBODIMENTS

Figure 1:
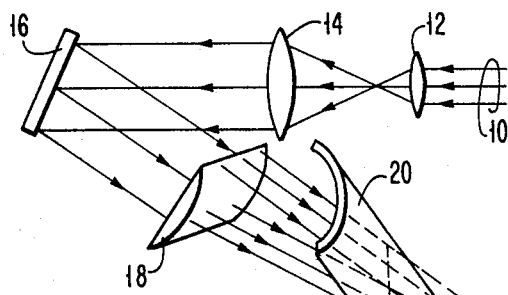
FIG. 1 is a diagrammatic showing of the optical system embodying the invention.

As illustrated in FIG. 1, the optical system embodying the invention comprises a beam 10 from a light source directed along a predetermined path as shown by the arrows. The preferred light source is a pulsed excimer laser which produces a beam that has substantially uniform intensity over its width rather than a gaussian intensity distribution. The beam 10 is directed to spherical lenses 12, 13 which expand the beam, but do not otherwise affect the beam shape. A reflective optical element 16 directs the beam to a cylindrical lens 18 which has power in one direction so that the beam is directed toward a first location S' at which the beam is focused to a line image having uniform distribution along its length. However, a curved reflective optical element 20 is interposed at an angle between cylindrical lens 20 and location S' to produce at a second location S a curved line source having uniform distribution along its length. A diffuser member 22 is fixed at location S to receive the curved line source and produce a curved self-luminous distribution emitting into a wide NA.

In a specific embodiment the second location S is the lamp plane of the normal condenser system 24 in a photolithographic projection tool, and the curvature of reflective optical element 20 is chosen to match the curvature of the lamp source in the projection tool. In cases in which the lamp is arc-shaped, then reflective optical element 20 would comprise a cylindrical segment inclined at a specific angle to direct the curved line source to the lamp plane of the projection tool. In this apparatus the proper NA is selected by choosing a particular aperture in the aperture wheel 26 so that the light incident upon mask member 28 has the desired degree of partial coherence.

In a specific example in which an excimer laser light source was coupled into an existing projection tool, full wafer uniform exposures in scan time as short as a few seconds were achieved which represents an order of magnitude improvement in the exposure times.

Figure 2:
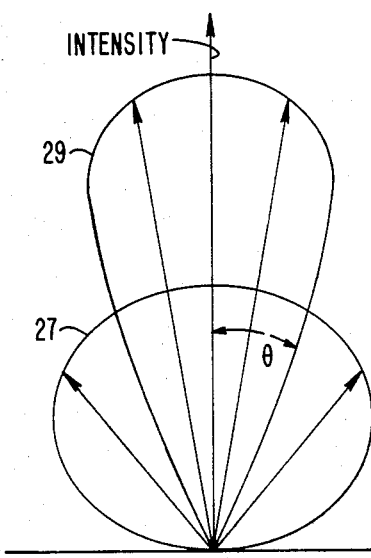
FIG. 2 is a diagram showing typical representations of the intensity distribution of scattered light from a conventional diffuser and a directional diffuser.

Although this exposure time represented a significant improvement in exposure times within the existing projection tool, these exposure times can be significantly further improved by making the diffuser member 22 directional so that a much larger fraction of the scattered light is in the numerical aperture that is accepted by the selected aperture 30 in aperture wheel 26. This is shown graphically in FIG. 2 in which a first polar plot 27 is shown for the typical intensity distribution for a conventional diffuser and a second polar plot 29 is shown for a directional diffuser. These plots show that the intensity distribution is greater for small angles with the directional diffuser.

Figure 3:
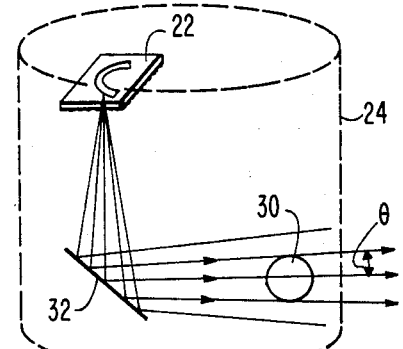
FIG. 3 is a diagrammatic schematic view showing the effect of a directional diffuser on the operation of a specific optical lithography apparatus.

A schematic view of the condenser system 24 is shown in FIG. 3 which illustrates the limited cone of light available to expose mask member 28. In this condenser system 24 the light incident on diffuser member 22 is diffused, and the light within the cone of acceptance is directed by reflective optical means 32 shown schematically in the drawing to the selected aperture 30. In the specific example referred to above, the largest half angle $\theta$ of light acceptance for that projection tool is about seven degrees.

Figure 4:
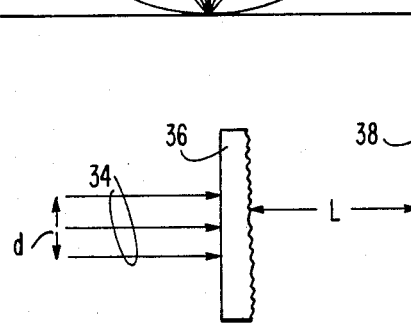
FIG. 4 is a diagram showing a method whereby a directional diffuser can be fabricated to produce a predetermined scattering characteristic.
Figure 5:
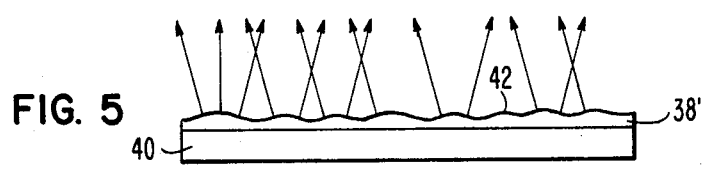
FIG. 5 is a directional diffuser produced according to the method illustrated in FIG. 4.

One suitable method for producing a directional diffuser is illustrated in FIGS. 4 and 5. This method utilizes a coherent radiation source 34 which is directed to a diffuser member 36. The scattered radiation from diffuser member 36 is directed to expose a suitable photoresist material 38 deposited on a flat substrate 40. The scattered radiation produces a speckle pattern in the photoresist 38. It is a characteristic of coherent light that interference patterns are produced when the coherent light is reflected or scattered from optical elements or diffuse reflectors. These interference patterns commonly appear as "laser speckle," a 100% modulation of the optical intensity with a modulation period much smaller than the size of the illuminated area.

The photoresist material 38' exposed with the speckle pattern is then underdeveloped by adjusting the development time to produce surface relief 42 of the desired depth. With no development, the photoresist surface is mirrorlike and therefore there is negligible scattering, whereas, with long development time, the surface has sharp relief so that the light is diffused over a large variety of angles and the cone angle increases. However, for an underdeveloped resist, more gentle undulations are produced (as shown by the arrows in FIG. 5) so that the range of angles over which the incident light is diffused is correspondingly smaller. Thus, the scattering cone angle is controlled by the development parameters.

The directional diffuser can be used in either a transmission or reflection mode. Should the directional diffuser be used in the reflection mode, the photoresist surface is metallized after the desired degree of development of the photoresist material 38. For a transmission mode directional diffuser, the substrate is made of a transparent material such as quartz and the metallizing step is omitted. If the resist material is not transparent at the desired wavelength, the pattern is transferred into the quartz.

The size of the scattering centers in the directional diffuser can be conveniently controlled by the appropriate positioning of the elements as given by the following relationship and as shown in FIG. 4.

$$\text{Average Speckle size} = s = \frac{\lambda L}{d}$$

d = diameter of the coherent beam 34
L = distance between diffuser member 36 and photoresist 38 surface
$\lambda$ = wavelength of coherent beam 34

To produce a finer diffuser, one should increase d and/or reduce L.

While the invention has been particularly shown and described with reference to a preferred embodiment thereof, it will be understood by those skilled in the art that various other changes in the form and details may be made therein without departing from the spirit and scope of the invention.

Having thus described our invention, what we claim as new, and desire to secure by Letters Patent is:

1. Apparatus for producing a curved line source of a desired shape from a collimated light source comprising
a source for producing a large area substantially collimated light beam and means for directing light from said source along a predetermined path;
first optical means along said predetermined path to direct light toward a virtual line image at a first predetermined location;
second optical means interposed between said first optical means and said first predetermined location to produce an arc shaped beam and to direct said beam to a second location; and
third optical means comprising a diffuser fixed at said second location to receive said arc shaped beam whereby impingement of said beam upon said third optical means produces a continuous self-luminous curved line source of a desired shape.

2. The apparatus of claim 1 wherein said first optical means comprises a cylindrical lens.

3. The apparatus of claim 1 wherein said second optical means comprises a cylindrical mirror inclined at an angle to said predetermined path.

4. The apparatus of claim 1 wherein said diffuser comprises a directional diffuser.

5. The apparatus of claim 2 wherein said second optical means comprises a cylindrical mirror inclined at an angle to said predetermined path.

6. The apparatus of claim 2 wherein said diffuser comprises a directional diffuser.

7. The apparatus of claim 3 wherein said diffuser comprises a directional diffuser.

8. The apparatus of claim 5 wherein said diffuser comprises a directional diffuser.

* * * * *